United States Patent [19]

Kondo et al.

[11] Patent Number: 5,068,164
[45] Date of Patent: Nov. 26, 1991

[54] DEVELOPER WITH HYDROXYARYL FATTY ACID FOR MAKING LITHOGRAPHIC PRINTING PLATE

[75] Inventors: Toshiro Kondo; Hidetoshi Miura, both of Nagaokakyo, Japan

[73] Assignee: Mitsubishi Paper Mills, Ltd., Tokyo, Japan

[21] Appl. No.: 499,660

[22] Filed: Mar. 27, 1990

[30] Foreign Application Priority Data

Mar. 29, 1989 [JP] Japan ................................. 1-77851

[51] Int. Cl.$^5$ ................................................. G03C 5/54
[52] U.S. Cl. ........................................ 430/204; 430/248; 430/251; 430/429; 430/486; 430/487; 430/493
[58] Field of Search ............... 430/204, 244, 248, 249, 430/251, 429, 486, 487, 493

[56] References Cited

U.S. PATENT DOCUMENTS

| | | | |
|---|---|---|---|
| 3,870,479 | 3/1975 | Kubotera et al. | 430/204 |
| 4,297,429 | 10/1981 | Kanada et al. | 430/204 |
| 4,297,430 | 10/1981 | Kanada et al. | 430/204 |
| 4,355,090 | 10/1982 | Yamada et al. | 430/204 |
| 4,362,811 | 12/1982 | Iguchi et al. | 430/204 |

*Primary Examiner*—Richard L. Schilling
*Attorney, Agent, or Firm*—Cushman, Darby & Cushman

[57] ABSTRACT

The present invention provides a developer for making a lithographic printing plate by silver complex diffusion transfer process which contains a hydroxyaryl fatty acid. This hydroxyaryl fatty acid preferably has the formula:

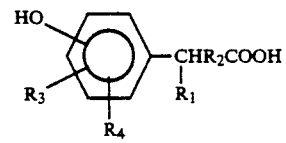

wherein $R_1$ represents a straight chain alkyl group of 1-19 carbon atoms and $R_2$ represents a straight chain alkylene group of 1-19 carbon atoms with a proviso that sum of carbon atoms of $R_1$ and $R_2$ is 10-20 and $R_3$ and $R_4$ each represents a hydrogen atom, a hydroxyl group or an alkyl or alkoxy group of 1-9 carbon atoms.

7 Claims, No Drawings

DEVELOPER WITH HYDROXYARYL FATTY ACID FOR MAKING LITHOGRAPHIC PRINTING PLATE

BACKGROUND OF THE INVENTION

The present invention relates to a developer used for making lithographic printing plates by silver complex diffusion transfer process.

Printing plates where silver images obtained by silver complex diffusion transfer process (DTR process) which is one of photographic reproduction methods are used as offset printing original plates are disclosed in Japanese Patent publication (Kokoku) Nos. 46-43132 and 48-30562. Furthermore, positive type printing original plate is mentioned in Japanese Patent Publication (Kokai) No. 49-55402 and negative type printing original plate is mentioned in Japanese Patent Publication (Kokai) Nos. 52-106902 and 52-112402.

According to a typical silver complex diffusion transfer process suitable for making these lithographic printing plates, a light sensitive material which comprises a support and a subbing layer which serves also as an anti-halation layer, a silver halide emulsion layer and a physical development nuclei layer provided on said support is exposed imagewise and developed, whereby silver halide of latent image area becomes black silver in the emulsion layer and simultaneously silver halide of non-latent image area is dissolved by the action of a silver halide complexing agent contained in a processing solution and diffuse to the surface of the light sensitive material. Thus, dissolved and diffusing silver complex salt is precipitated as silver image on the physical development nuclei in the surface layer by reducing action of developing agent. Following the development, if necessary, the material is subjected to a sensitizing treatment to increase ink receptivity of the silver image. Then, thus obtained lithographic printing plate is mounted on an offset printing machine and printing is carried out by transferring the inked image to a substrate.

Various properties required for such lithographic printing plate depend greatly upon plate making step, especially, developing step as well as on printing materials. That is, state of silver image formed by transfer development is one of the significant factors of influence on printing characteristics and important causes for the state of silver image are conditions for formation of transferred silver grains, for example, diffusion speed, stability and reduction rate of silver complex salt.

U.S. Pat. Nos. 4,297,429, 4,297,403 and 4,355,090 disclose that kind of silver halide solvent has an important effect on conditions for formation of transfer silver grains.

However, only selection of silver halide solvent cannot result in transfer silver grains of sufficiently high printing endurance.

SUMMARY OF THE INVENTION

The object of the present invention is to provide a processing solution suitable for making lithographic printing plate of sufficiently high endurance by silver complex diffusion transfer process.

The above object has been attained by a developer used for making lithographic printing plate by silver complex diffusion transfer process, characterized by containing a hydroxyaryl fatty acid.

DESCRIPTION OF THE INVENTION

The hydroxyaryl fatty acid used in the present invention is preferably represented by the following formula [I]:

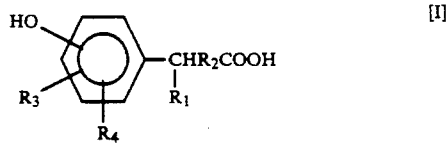

(wherein $R_1$ represents a straight chain alkyl group of 1-19 carbon atoms and $R_2$ represents a straight chain alkylene group of 1-19 carbon atoms, with a proviso that sum of the carbon numbers of $R_1$ and $R_2$ is 10-20, and $R_3$ and $R_4$ each represents a hydrogen atom, a hydroxyl group or an alkyl or alkoxy group of 1-9 carbon atoms).

As examples of the hydroxyaryl fatty acids of the formula [I] used in the present invention, mention may be made of hydroxyphenylmyristic acid, hydroxyphenylpalmitic acid, hydroxyphenylstearic acid, hydroxyphenyloleic acid, bis-hydroxyphenylstearic acid, hydroxyphenylbehenic acid, dihydroxyphenylpalmitic acid, trihydroxyphenylstearic acid, hydroxymethylphenylstearic acid, hydroxynonylphenylstearic acid, and hydroxymethoxypalmitic acid. These compounds may be in the form of salts such as alkali metal salts and organic amines.

Content of these fatty acids in developer is preferably about 0.5-about 40% by weight, more preferably about 1-about 30% by weight.

It is known to use water-soluble polymers such as carboxymethyl cellulose and hydroxyethyl cellulose as a thickening agent in diffusion transfer developer for making lithographic printing plates. (See, for example, Japanese Patent Publication (Kokai) Nos. 48-76603 and 56-6237). However, such polymers have substantially no action to improve printing endurance.

It has not yet been known how the above fatty acids of the present invention improve the printing endurance, but it is considered that they take part in transfer development to form transfer silver which is strong enough to stand mechanical pressure. This advantageous effect is unexpectedly great. For example, this effect cannot be recognized when the fatty acid of the present invention is applied to the surface of printing plate after transfer silver image has been formed.

Besides, the developer of the present invention does not deteriorate the ink receptivity at printing.

The processing solution for development of the present invention may contain alkaline substances such as sodium hydroxide, potassium hydroxide, lithium hydroxide, and trisodium phosphate; preservatives such as sulfites; silver halide solvents such as thiosulfites, thiocyanates, cyclic imides, thiosalicylic acid, and amines; thickening agents such as hydroxyethyl cellulose and carboxymethyl cellulose; antifoggants such as potassium bromide, 1-phenyl-5-mercaptotetrazole and compounds mentioned in Japanese Patent Publication (Kokai) No. 47-26201; developing agents such as hydroquinone and 1-phenyl-3-pyrazolidone; development modifiers such as polyoxyalkylene compounds and onium compounds.

In carrying out the silver complex diffusion transfer process, the developing agent may be contained in the silver halide emulsion layer and/or the image receiving layer or other water permeable layers contiguous to the image receiving layer as described in British Patent Nos. 1,000,115, 1,012,476, 1,017,273 and 1,042,477. Therefore, in such case, a so-called "alkaline activation solution" containing no developing agent may be used as the processing solution used in developing stage.

Silver halide emulsion used in the lithographic printing plate used for carrying out the present invention may be silver chloride, silver bromide, silver chlorobromide, silver chloroiodide, silver chlorobromoiodide, etc. and preferably the silver halide comprises at least 50 mol % of silver chloride. These silver halide emulsions may contain spectral sensitizers (spectral sensitizing dyes for respective light sources and uses, for example, camera type, laser beam type, panchromatic type for color separation), gelatin hardeners, coating aids, antifoggants, plasticizers, developing agents, matting agents, etc.

As binders for silver halide emulsions, there may be used natural or synthetic binders generally used for this purpose such as gelatin, colloidal albumin, and cellulose derivatives.

A subbing layer for improving adhesion and/or an undercoat layer for prevention of halation may be provided underneath the silver halide emulsion layer (on the support) and these layers may contain developing agent and matting agent.

The support on which silver halide emulsion layer is coated includes, for example, paper, various films, and paper and metal coated with plastics or resin-like materials such as polyethylene.

Known physical development nuclei may be used for physical development nuclei layer and examples thereof are metals such as antimony, bismuth, cadmium, cobalt, palladium, nickel, silver, lead and zinc and sulfides thereof. This physical development nuclei layer may also contain a developing agent and besides, may contain a hydrophilic binder.

The lithographic printing plates made according to the present invention can be rendered ink receptive or enhanced in ink receptivity by use of such compounds as mentioned in Japanese Patent Publication (Kokoku) No. 48-29723 and U.S. Pat. No. 3,721,539.

The printing method, etch solution and dampening solution are those which are known to the art.

The following nonlimiting examples further illustrate the invention.

EXAMPLE 1

On one side of a subbed polyester film support, was provided a matting layer containing silica powder having an average particle size of 5 μ. On another side, was provided an antihalation undercoat layer (adjusted to pH 4.0) containing carbon black in such amount as providing a light reflectance of 3% for light of 633 nm and silica powder having an average particle size of 7 μm in an amount of 20% by weight of photographic gelatin. On this undercoat layer was provided a high sensitivity silver chloride emulsion layer (adjusted to pH 4.0) containing silica powder having an average particle size of 7 μm in an amount of 5% by weight of photographic gelatin, which had been chemically sensitized and then spectrally sensitized.

The application rate of gelatin in the undercoat layer was 3.5 g/m², that of gelatin in the emulsion layer was 0.8 g/m² and that of silver halide in terms of silver nitrate was 1.0 g/m². These undercoat layer and emulsion layer contained 5.0 mg/g (based on gelatin) of formalin as a hardener. After drying, the coated support was heated at 40° C. for 14 days. Then, the emulsion layer was overcoated with a nuclei coating composition mentioned in Japanese Patent Publication (Kokai) No. 54-103104 (plate No. 31 of Example 2) and was dried to obtain a light sensitive material for lithographic printing plate. The above silver halide emulsion contained $4 \times 10^{-6}$ mol of rhodium chloride for one mol of silver halide which had been added during physical ripening of the emulsion and had an average grain size of 0.40 μ.

The resulting light sensitive material for lithographic printing plate was exposed imagewise by a process camera having a reversal mechanism, developed with the following developer A (used) at 30° C. for 30 seconds and then treated with the following neutralizing solution.

| Developer A: | |
| --- | --- |
| Sodium hydroxide | 24 g |
| Potassium hydroxide | 8 g |
| Anhydrous sodium sulfite | 50 g |
| 3-Mercapto-4-acetamido-5-n-heptyl-1,2,4-triazole | 0.15 g |
| 2-Mercaptobenzoic acid | 0.1 g |
| 2-Methyl-2-amino-1-propanol | 30 g |
| Uracil | 0.2 g |
| Water to make up 1 liter | |
| Neutralizing solution: | |
| Ethylene glycol | 5 g |
| Colloidal silica (20% aqueous solution) | 1 g |
| Citric acid | 10 g |
| Sodium citrate | 35 g |
| Water to make up 1 liter | |

The above procedure was repeated except that developer B prepared by adding 3% by weight of hydroxyphenylstearic acid (trademark NOVAACID P manufactured by Nippon Oil & Fats Co., Ltd.) to the above developer A was used in place of developer A.

The resulting lithographic printing plates were mounted on an offset printing machine and the following etch solution was applied to allover the plate surface and printing was carried out using the following dampening solution.

| Etch solution: | |
| --- | --- |
| Water | 600 ml |
| Isopropanol | 400 ml |
| Ethylene glycol | 50 g |
| 3-Mercapto-4-acetamido-5-n-butyl-1,2,4-triazole | 1 g |
| Dampening solution (diluted to tenfold with water in use): | |
| Water | 800 ml |
| Succinic acid | 6 g |
| Sodium sulfate | 25 g |
| Ethylene glycol | 100 g |
| Colloidal silica (20% aqueous solution) | 28 g |

The printing machine used was A.B. Dick 350 CD (trademark for offset printing machine of A.B. Dick Co.).

In the case of the printing plate made using developer A, partial disappearance of transfer silver image occurred before printing of 5,000 copies while in the case of the printing plate made using developer B according to the present invention, no disappearance of the transfer silver image occurred even after printing of 10,000 copies. There was no difference in ink receptivity between these printing plates.

EXAMPLE 2

Example 1 was repeated except that in place of NOVAACID P used in developer B, an amine salt thereof (trademark NOVASALT 40M manufactured by Nippon Oil & Fats Co., Ltd.) was used to obtain the results similar or superior to those obtained in Example 1 where the developer B was used.

EXAMPLE 3

The procedure of Example 1 was repeated using the following developer to which was added 5% by weight of hydroxy-methyl-phenylstearic acid, dihydroxyphenylstearic acid, hydroxyphenylbehenic acid or dihydroxyphenylbehenic acid to obtain the similar results to those of Example 1.

| Developer: | |
|---|---|
| Sodium hydroxide | 20 g |
| Anhydrous sodium sulfite | 80 g |
| Hydroquinone | 12 g |
| 1-Pheny-3-pyrazolidone | 2 g |
| Sodium thiosulfate | 16 g |
| Potassium bromide | 2 g |
| 3-Mercapto-4-acetamido-5-n-heptyl-1,2,4-triazole | 0.1 g |
| Water to make up 1 liter | |

As explained above, lithographic printing plates made using the developer of the present invention are prevented from disappearance if transfer silver image, markedly improved in printing endurance without reduction of ink receptivity.

What is claimed is:

1. A method for making a lithographic printing plate which comprises exposing imagewise a light sensitive material comprising a support, a silver halide emulsion layer and a physical development nuclei layer and then developing the light sensitive material with an aqueous alkaline developing composition containing a hydroxyaryl fatty acid in the presence of a silver halide solvent to transfer silver complexes formed from unexposed silver halide to the physical development nuclei layer to form a silver transfer image.

2. A method according to claim 1, wherein the hydroxyaryl fatty acid is represented by the formula:

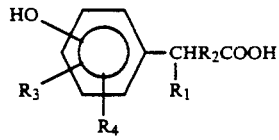

wherein $R_1$ represents a straight chain alkyl group of 1-19 carbon atoms and $R_2$ represents a straight chain alkylene group of 1-19 carbon atoms with a proviso that sum of carbon atoms of $R_1$ and $R_2$ is 10-20 and $R_3$ and $R_4$ each represents a hydrogen atom, a hydroxyl group or an alkyl or alkoxy group of 1-9 carbon atoms.

3. A method according to claim 1, wherein the hydroxyaryl fatty acid is selected from the group consisting of hydroxyphenylmyristic acid, hydroxyphenylpalmitic acid, hydroxyphenylstearic acid, hydroxyphenyloleic acid, bis-hydroxyphenylstearic acid, hydroxyphenylbehenic acid, dihydroxyphenylpalmitic acid, trihydroxyphenylstearic acid, hydroxymethylphenylstearic acid, hydroxynonylphenylstearic acid, and hydroxymethoxypalmitic acid.

4. A method according to claim 1, wherein the hydroxyaryl fatty acid is in the form of an alkali metal salt or organic amine thereof.

5. A method according to claim 1, wherein content of the hydroxyaryl fatty acid in the developing composition is about 0.5% by weight–about 40% by weight.

6. A method according to claim 1, wherein the developing composition additionally contains a preservative and a silver halide solvent.

7. A method according to claim 1, wherein the developing composition additionally contains a developing agent.

* * * * *